United States Patent [19]

Tada et al.

[11] Patent Number: 4,974,375
[45] Date of Patent: Dec. 4, 1990

[54] ICE PARTICLE FORMING AND BLASTING DEVICE

[75] Inventors: Masuo Tada, Yao; Takaaki Fukumoto; Toshiaki Ohmori, both of Itami, all of Japan

[73] Assignee: Mitsubishi Denki Kabushiki Kaisha, Japan

[21] Appl. No.: 434,982

[22] Filed: Nov. 9, 1989

[30] Foreign Application Priority Data

Nov. 11, 1988 [JP] Japan ................. 63-284921

[51] Int. Cl.$^5$ .................... B24C 3/22; B24C 3/18; B24C 1/00; B08B 7/00
[52] U.S. Cl. ........................... 51/413; 51/419; 51/320; 261/124; 134/7
[58] Field of Search ................ 51/319, 320, 321, 413, 51/410, 419, 436, 317; 134/7, 17; 261/122, 124

[56] References Cited

U.S. PATENT DOCUMENTS

| | | | |
|---|---|---|---|
| 2,699,403 | 1/1955 | Courts | 117/47 |
| 3,162,019 | 12/1964 | Porter et al. | 62/67 |
| 3,218,781 | 11/1965 | Allemann et al. | 261/124 X |
| 4,073,158 | 2/1978 | Guiller | 62/266 |
| 4,389,820 | 6/1983 | Fong et al. | 51/410 |
| 4,402,193 | 9/1983 | McFee | 62/304 |
| 4,655,847 | 4/1987 | Ichinoseki et al. | 134/7 |
| 4,731,125 | 3/1988 | Carr | 134/17 |
| 4,806,171 | 2/1989 | Whitlock et al. | 134/7 |
| 4,869,090 | 9/1989 | Tada et al. | 51/320 |

FOREIGN PATENT DOCUMENTS

| | | | |
|---|---|---|---|
| 58-102674 | 6/1983 | Japan | 51/319 |
| 60-67077 | 4/1985 | Japan . | |
| 61-2859 | 1/1986 | Japan . | |
| 1397102 | 6/1975 | United Kingdom | 51/320 |

Primary Examiner—Robert A. Rose
Assistant Examiner—Bruce P. Watson
Attorney, Agent, or Firm—Leydig, Voit & Mayer

[57] ABSTRACT

A solid surface cleaning device utilizes a jet of ice particles of ultrapure water for removing contaminants from a surface of a solid such as a semiconductor wafer. The electrical resistivity of ultrapure water stored in a tank is reduced by means of a gas such as dry air or carbon dioxide evolving into the water from a bubble tube disposed in the tank. The water whose resistivity is thus reduced is sprayed from a nozzle into an ice-making container which is refrigerated by the vaporization of a refrigerant discharged into the container. The fine ice particles that are thus generated in the container are sprayed and blasted from a jet spray nozzle onto the surface of the cleaned solid supported within a jet spray chamber. The air inside the chamber is exhausted by a blower together with the ice particles that have been ejected from the jet spray nozzle.

11 Claims, 2 Drawing Sheets

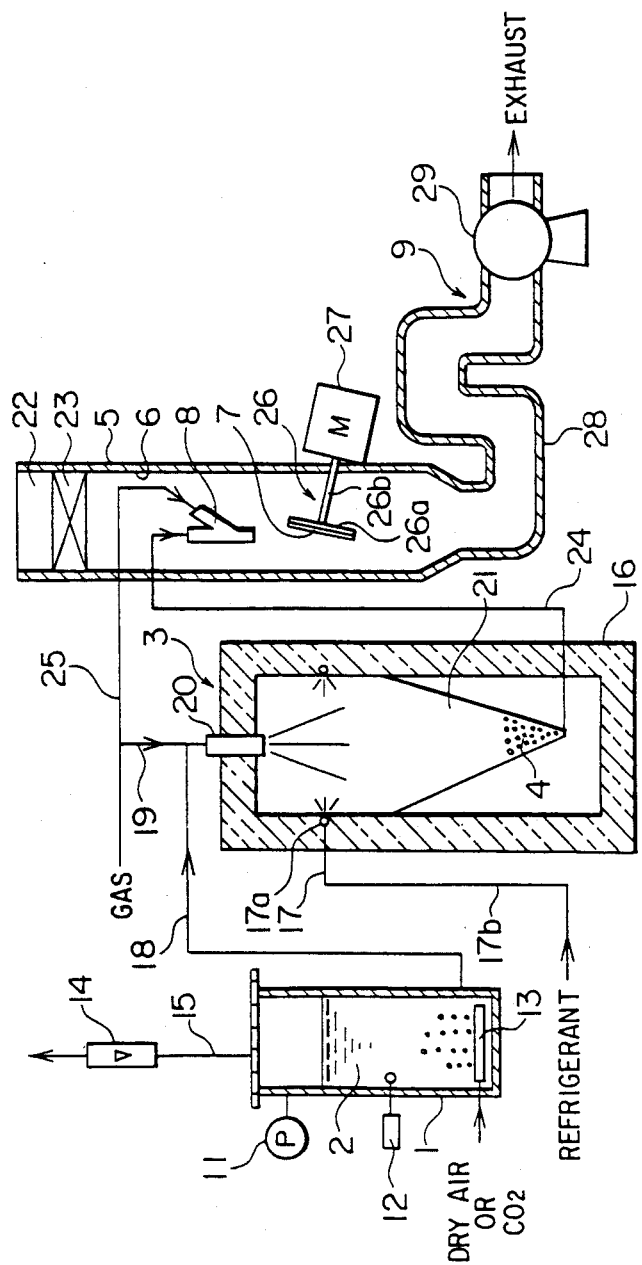
F I G. 3

4,974,375

ICE PARTICLE FORMING AND BLASTING DEVICE

BACKGROUND OF THE INVENTION

This invention relates to solid surface cleaning devices which, generate fine frozen particles such as ice particles that are utilized as abrasive grains or an abrasive for the surface treatments such as cleaning or blasting, spray such fine particles under a high pressure onto the surfaces of solid bodies such as semiconductor wafers to clean them.

Wet cleaning equipment, as shown in FIG. 1, for washing off contaminating foreign materials from the surfaces of solid bodies such as semiconductor wafers is already known. Ultrapure water is sprayed from the jet nozzle 101, under a high pressure, exceeding 100 kg/cm$^2$G, onto the surface of the cleaned solid 102, such as a semiconductor wafer, thereby removing the contaminating materials, etc.

Further, wet cleaning equipment as shown in FIG. 2 is also already known. Ultrapure water is sprayed under high pressure from the jet nozzle 101 onto the surface of the cleaned solid such as a semiconductor wafer. At the same time, a cylindrical brush 104 attached to a shaft 103 and rotated in the direction shown by an arrow A is translated in the direction B in sliding contact with the surface of the cleaned solid 102. In this manner, the contaminating materials are washed off and removed from the surface of the cleaned solid 102.

The types of cleaning equipment as shown in FIGS. 1 and 2 have the following disadvantages.

In the case of the conventional solid surface cleaning device as shown in FIG. 1, it is difficult to remove from the surface of the cleaned solid 102 the contaminating materials that are attached thereto with a strong adhesive force, and a pressure above 100 kg/cm$^2$G is needed for the purpose of removing such securely attached contaminants. When, however, water is ejected with such a high pressure, the inner surface of the jet nozzle 101 is abraded by the fast running water, with the result that the particles abraded from the inner surface of the nozzle contaminate the surface of the cleaned solid 102.

On the other hand, the conventional solid surface cleaning device as shown in FIG. 2 has the following disadvantages.

(1) It is difficult to clean and remove, for example, ultra-fine contaminating particles having particle sizes of less than about 10 micrometer ($\mu$m) in diameter.

(2) There is the danger that contamination may take place on the cleaned solid surface due to the abrasion of the brush.

(3) The cleaning efficiency is decreased due to static electrical charges induced on the cleaned solid surface from the friction between the brush and the cleaned solid surface.

(4) The contaminating particles attached to the brush after being removed from the cleaned solid surface may again be attached to the cleaned solid surface.

(5) The contaminating particles attached to the brush damage the cleaned solid surface.

SUMMARY OF THE INVENTION

This invention has been made to overcome the difficulties of the conventional cleaning equipment as described above. Thus, the object of this invention is to provide a solid surface cleaning device which has the following characteristics. First, the capacity to efficiently remove the contaminating materials such as foreign materials attached to the solid surface with strong adhesive force, without damaging the solid surface. Second, the capacity to rapidly wash off and remove foreign materials that have once been taken off the solid surface. Third, the capacity to prevent electrical charging of the solid surface and hence to prevent the attachment of foreign materials thereto from the electrostatic force occasioned by the electrification.

The solid surface cleaning device according to this invention, for removing contaminating materials attached to a surface of a solid body, comprises a tank for storing a liquid (e.g., ultrapure water) whose electrical resistivity is adjusted and reduced to a predetermined level; frozen particle generating means, coupled to the tank, for freezing the liquid supplied from the tank to generate ultra-fine frozen particles of the liquid; a cleaning housing containing therein a jet spray chamber within which a cleaned solid body such as a semiconductor wafer is accommodated; jet spray means, disposed in the jet spray chamber and coupled to the frozen particle generating means, for spraying the frozen particles supplied from the frozen particle generating means onto a surface of the cleaned solid body, thereby removing contaminating materials attached to the cleaned solid surface; and exhaust means, coupled to the jet spray chamber, for rapidly exhausting the gas within the jet spray chamber (e.g., air introduced into the jet spray chamber) together with the ice particles that have been sprayed from the jet spray nozzle onto the cleaned solid surface.

In a preferred form, the tank may comprise a resistivity adjustment means for adjusting and reducing the electrical resistivity of said liquid. The resistivity adjusting means comprising means for forming bubbles of an electrolyte-forming gas within the liquid stored in the tank, the resistivity of the liquid being reduced and adjusted by the amount of the gas dissolved into the liquid. Further, the frozen particle generating means may comprise the following: an ice-making container; spray means, coupled to said tank, for spraying the liquid supplied from the tank into an interior of the container; and refrigerating means for refrigerating the interior of the container. Furthermore, the particle size of the frozen particles generated by the frozen particle generating means can be reduced by heating and vaporizing said liquid stored in the tank, wherein vapor of the liquid formed by the vaporization is supplied to said spray means of the frozen particle generating means, to be sprayed therefrom to form frozen particles.

The contaminating materials, such as foreign materials attached to the cleaned solid surface are removed by the cleaning device according to this invention as follows: first, they are removed by means of the frozen particles sprayed and blasted onto the cleaned solid surface; second, they are removed by the ultra-fine debris of the frozen particles that are formed by the collision of the frozen particles against the cleaned solid surface. Further, the contaminating materials thus removed from the cleaned solid surface are exhausted rapidly by the exhausting gas stream generated by the exhaust means, together with the frozen particles that have been sprayed onto the cleaned solid surface to form debris thereof. Thus, there is no danger that the cleaned solid surface will be statically charged by the ions present in the jet spray chamber or that the contaminating materials that have been removed from the cleaned solid surface will be re-attached thereto.

Thus, the advantages obtained by this invention may be summarized as follows. The contaminating materials are blown or scrubbed off from the cleaned solid surface by the frozen particles ejected from the jet spray nozzle and are removed therefrom with an extremely high efficiency. In addition, the frozen particles that have been effective in removing the contaminating materials are exhausted rapidly to the exterior together with the contaminating materials. Further, the resistivity of the liquid in the tank, and hence that of the frozen particles formed therefrom, are adjusted to a sufficiently low level. Thus, there is no danger that the contaminating materials which have been scrubbed off the solid surface will be re-attached to the solid surface due to electrostatic attraction. Further, the jet of frozen particles has an extremely high cleaning efficiency even at a low pressure compared with the jet of a liquid such as water in the liquid phase. Consequently, generation of dust at the jet spray means and damage to the cleaned solid surface can be avoided.

BRIEF DESCRIPTION OF THE DRAWINGS

The novel features of this invention are set forth with particularity in the appended claims. This invention itself, however, both as to its organization and method of operation, may best be understood from the detailed description of the preferred embodiments, taken in connection with the accompanying drawings, in which:

FIG. 3 is a diagramatic sectional view of a solid surface cleaning device according to this invention.

In the drawings, like reference numerals represent like or corresponding parts or portions.

DETAILED DESCRIPTION OF THE PREFERRED EMBODIMENTS

Figure 1:
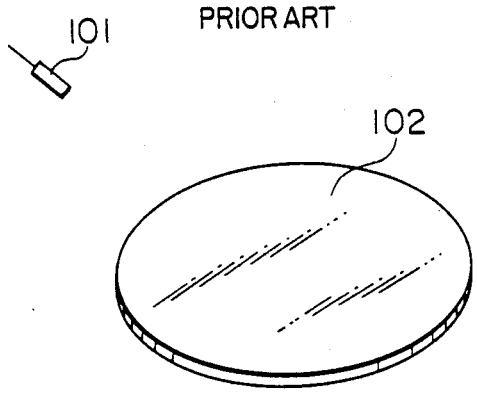
FIGS. 1 and 2 are schematic perspective views of conventional solid surface cleaning devices.
Figure 2:
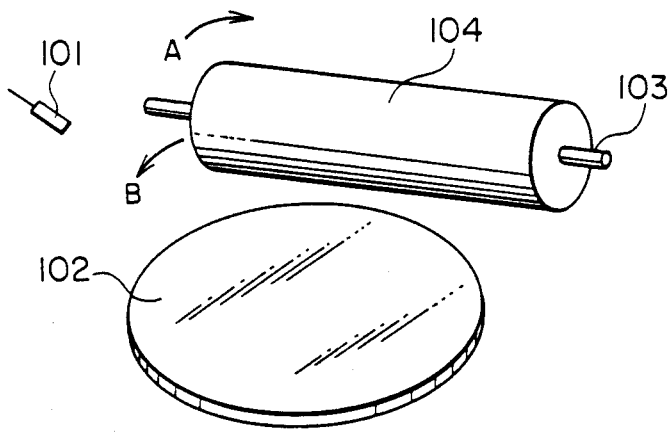
Figure 4:
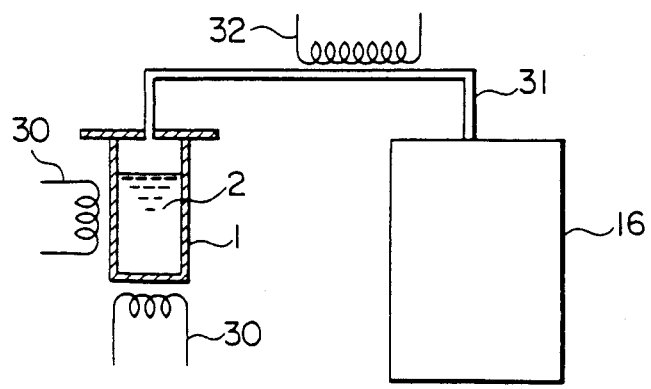
FIG. 4 is a diagramatic view, partly in section, of a portion of another solid surface cleaning device according to this invention.

Referring now to FIGS. 3 and 4 of the drawings, preferred embodiments of this invention are described.

FIG. 3 is a sectional view showing the overall structure of a solid surface cleaning device according to a first embodiment of this invention. As shown in FIG. 3, the solid surface cleaning device according to the first embodiment comprises: a tank 1 in which ultrapure water 2 is stored as the liquid that is to be frozen; frozen particle generating means designated generally by the reference numeral 3 which, coupled to the tank 1, freezes the ultrapure water 2 supplied from the tank 1 to generate ice particles 4 as the ultra-fine frozen particles; a cleaning housing 5 in which a jet spraying chamber 6 and a cleaned solid 7 such as a semiconductor wafer are disposed; a jet spray nozzle 8 is disposed within the jet spray chamber 6 as the jet spraying means, sprays and blasts onto the cleaned solid 6 the ice partices 4 supplied from the frozen particle generating means 3; and exhaust means 9 which is coupled to the jet spray chamber 6 and exhausts the gas contained therewithin rapidly to the outside together with the ice particles 4 that have been sprayed onto the cleaned solid 7. Further details of the device of FIG. 3 are as follows.

At an upper side surface of the cylindrical tank 1 containing the ultrapure water 2 is mounted a pressure gauge 11 for measuring the pressure of the gas present above the liquid surface within the tank 1. In addition, at a portion of the side surface of the tank 1 below the liquid surface is mounted a resistivity meter 12 for measuring the electrical resistivity of the ultrapure water 2 withing the tank 1. Furthermore, near the bottom surface of the tank 1 is disposed a bubble-forming tube 13 which supplies into the tank 1 a certain species of gas such as dry air or carbon dioxide gas which generates charged species when dissolved in water. The gas supplied from the tube 13 forms bubbles in the ultrapure water 2 to be dissolved therein. The furthest end of the bubble tube 13 is closed. The other end thereof is coupled to a gas supply source (not shown) for supplying gas such as dry air or carbon dioxide. A plurality of small holes are formed through the cylindrical side walls of the tube 13 to let out the gas supplied from the gas supply source into the ultrapure water 2. To the ceiling of the tank 1 is coupled a ventilating tube 15 at an intermediate point of which a flow meter 14 is disposed. The gas such as dry air or carbon dioxide for controlling the resistivity of the ultrapure water 2, which gas is discharged into the tank 1 from the bubble tube 13, forms bubbles within the ultrapure water 2 and, while moving upwards to the top surface of the ultrapure water 2, partially dissolves into the ultrapure water 2 to form charged species in the ultrapure water 2 and to thereby reduce the resistivity thereof. The gas evolving from the top surface of the water 2 is discharged via the ventilating tube 15 to the outside atmosphere. In the above process, the pressure of the gas within the tank 1 and the resistivity of the ultrapure water 2 can be controlled and modified at will by simply adjusting the amount of flow of the gas passing through the ventilating tube 15 wherein the adjustment of the amount of flow of the gas through the tube 15 is effected by means of the flow meter 14 based on the observation of the indication of the resistivity meter 12. In this connection, it is pointed out that the amount of flow of the gas such as dry air or carbon dioxide should be set at a sufficiently large level so that the pressure within the tank 1 will not fluctuate due to the presence of the pressure gauge 11 coupled to the tank 1.

It is further pointed out that, instead of controlling the resistivity of the ultrapure water 2 by dissolving the gas such as dry air or carbon dioxide thereinto by means of the bubble tube 13, ultrapure water may be utilized whose resistivity is adjusted to a predetermined level by previously dissolving such gas therein.

The frozen particle generating means 3, which generates ultra-fine ice particles by freezing the ultrapure water supplied from the tank 1, comprises a hollow cylindrical ice-making container 16 surrounded by a heat-insulating material; a refrigerating means 17 for refrigerating the ice-making container 16; a spray nozzle 20 coupled, via a water supply tube 18, to a lower part of the tank 1, and, via a gas supply tube 19, to a gas supply source (not shown) storing a gas such as nitrogen gas; and a funnel-shaped ice storage volume 21 which, is defined within the ice container 16, stores the fine ice particles 4 made within the ice making container 16. The refrigerating means 17 comprises an annular refrigerant supply tube 17a which is disposed at an upper side wall of the ice-making container 16 and communicates with the interior of the ice-making container 16 via a plurality of small holes formed through the walls thereof, and a communicating tube 17b which communicates the refrigerant supply tube 17a to a refrigerant supply source (not shown) for supplying a refrigerant such as liquid nitrogen. Thus, the refrigerating means 17 supplies the refrigerant such as liquid nitrogen from the refrigerant supply source to the ice making container 16 via the communicating tube 17b and the refrigerant supply tube 17a, thereby cooling and refrigerating the interior of the ice making container 16 by means of the vaporization heat absorbed by the evaporation of the refrigerant.

The cleaning housing 5 consists of a substantially upright cylindrical member in which a jet spray chamber 6 is located. At the top end of the cleaning housing 5, which is open to the outer atmosphere, are disposed, from top to bottom (or from the outer to the inner side) of the housing, an ion neutralizing device 22 and a filter 23 adjacent thereto, and to the lower side of the filter 13 is disposed the jet spray nozzle 8 having a jet spray orifice directed downward.

As shown in the figure, the upper end of the jet spray nozzle 8 is bifurcated into a pair of suction ports, one of which is coupled via the ice supply tube 24 to the bottom end of the funnel-shaped ice storage volume 21 defined within the ice making container 16 and the other of which ports is coupled via a gas supply tube 25 to a pressurized gas source (not shown). Thus, the ice particles 4 supplied from the ice storage volume 21 are sprayed and blasted from the ejection orifice of the jet spray nozzle 8, together with the pressurized gas supplied from the pressurized gas source, onto the surface of the cleaned solid 7 such as a semiconductor wafer that is situated thereunder.

Below the jet spray nozzle 8 is disposed a holder 26 for holding and supporting the cleaned solid 7. The holder 26 comprises a support table 26a for supporting the cleaned solid 7 and a rotating support shaft 26b which is fixed at the outer end thereof to the support table 26a and at the other end thereof to the rotation shaft of the motor 27. Thus, the support table 26a is rotated by the operation of the motor 27 via the rotating support shaft 26b.

The exhaust means 9 comprises an inverted U-shaped exhaust tube 28 coupled to the bottom end of the hollow cylindrical cleaning housing 5 and a blower 29 disposed at the end of the exhaust tube 28. Thus, by means of the operation of the blower 29, the air within the jet spray chamber 6 within the cleaning housing 5 is exhausted to the outside via the exhaust tube 28.

Next, the operation of the first embodiment shown in FIG. 3 is described.

First, gas such as dry air or carbon dioxide is supplied from the gas supply source (not shown) to the tank 1 filled with ultrapure water 2, so that bubbles are formed in the ultrapure water 2 within the tank 1 to dissolve the gas such as air or carbon dioxide into the ultrapure water 2, thereby reducing the resistivity of the ultrapure water 2 by ionizing a portion thereof. At the same time, the flow meter 14 is adjusted on the basis of the observation of the resistivity meter 12 to adjust the amount of flow of the gas exhausted through the ventilating tube 15, and the amount of flow of the gas such as dry air or carbon dioxide supplied to the ultrapure water 2 within the tank 1 is thereby adjusted to adjust the dissolved amount of the gas, so that the resistivity of the ultrapure water 2 is adjusted provisionally to an appropriate value.

Next, refrigerant such as liquid nitrogen is supplied from the refrigerant supply source (not shown) to the interior of the ice making container 16 via the communication tube 17 and the refrigerant supply tube 17a to vaporize the refrigerant, thereby sufficiently cooling and refrigerating beforehand the interior of the ice making container 16. The interior of the ice making container 16 is thus refrigerated beforehand, the ultrapure water 2 mixed with a pressurized gas is sprayed from the spray nozzle 20 as follows. The ultrapure water 2 having its resistivity adjusted provisionally to an appropriate value as described above is supplied from the tank 1 to the spray nozzle 20 via the water supply tube 18. At the same time, the gas such as nitrogen gas is supplied from a pressurized gas supply source (not shown) to the spray nozzle 20 via the gas supply tube 19 to mix with the ultrapure water 2, and the ultrapure water 2 thus mixed with the pressurized gas is sprayed from the spray nozzle 20 to form fine particles. The ultrapure water 2 thus sprayed in fine particles is frozen by the heat exchange with the refrigerant within the ice making container 16 to form fine frozen particles i.e., ice particles 4. At this juncture, it is noted that the particle diameters of the fine frozen ice particles 4 depend on the pressure of the ultrapure water 2 supplied to the spray nozzle 20 wherein the particle diameters of the ice particles 4 are reduced as the pressure of the ultrapure water increases. In addition, the particle diameters can be further reduced by mixing the ultrapure water 2 with a gas such as the nitrogen gas to form a two-phase fluid that is ejected from the nozzle 20. In this manner, the particle diameters of the frozen particles can be modified and controlled within the range of about 20 micrometers to 5 millimeters.

The frozen particles, i.e., the ice particles 4, obtained as described above are stored in the funnel shaped ice storage volume 21 within the ice making container 16. Further, they are guided, via the ice particle supply tube 24, from the bottom portion of the ice storage volume 21 to the jet spray nozzle 8 disposed in the jet spray chamber 6 within the cleaning housing 5. The ice particles 4 are sprayed and blasted therefrom, together with the pressurized gas such as the nitrogen gas supplied from the pressurized gas supply source (not shown) through the gas supply tube 25, onto the surface of the cleaned solid 7 such as a semiconductor wafer supported on the support table 26a of the support means 26. The foreign materials such as contaminating particles adhering on the surface of the cleaned solid 7 are removed efficiently from the solid surface by means of the ice particles 4 sprayed from the jet spray nozzle 8. At this juncture, it is noted that if the motor 27 is operated to rotate the cleaned solid 7 together with the support table 26a, the ice particles 4 blasted from the jet spray nozzle 8 hit uniformly over the whole surface of the cleaned solid 7, so that the solid surface can be cleaned uniformly.

In the above process, the ultrapure water 2 within the tank 2 is mixed beforehand with a gas such as dry air or carbon dioxide, and its resistivity is thereby reduced. Hence, the resistivity of the ice particles 4 generated from such ultrapure water 2 is sufficiently low so that the ice particles 4 blasted from the jet spray nozzle 8 or the ice particle debris generated by the breaking-up process thereof will not be charged electrostatically. Further, even if electrostatic charge is generated on the surface of the cleaned solid 7, it is quickly discharged via the ice particles or the debris thereof having a low resistivity. Hence, the solid surface is not charged during the cleaning process that is effected by means of the ice particles and that the contaminating materials which have been once removed from the solid surface are not again adhered to the solid surface due to the electrostatic force. Furthermore, the ultrapure water in which carbon dioxide is dissolved has a germicidal action. Thus, it effectively removes the germs even if germs happen to be brought into the ultrapure water 2 for some reason or another.

The ice particles 4 blasted from the jet spray nozzle 8 onto the cleaned solid 7 such as semiconductor wafer are, after removing the contaminating materials from the surface of the cleaned solid 7, exhausted from the jet spray chamber 6 to the exterior via the exhaust tube 28 by means of the blower 29. The interior of the jet spray chamber 6 is under forced exhaustion by means of the blower 29, and the air of the outer atmosphere, after being neutralized by the ion neutralizing device 22 with respect to the ions contained therein, passes the filter 23 to be cleaned of the floating dust contained therein. The thus cleaned and electrically neutralized air, which forms a laminar flow and flows in the blasting direction of the jet spray nozzle 8, exhausts quickly to the exterior, from the jet spray chamber 6 via the exhaust tube 28, the ice particles, which have been blasted onto the surface of the cleaned solid 7 to scrub off and remove the contaminating materials therefrom, the exhausted air also carrying with it the removed contaminating materials. Thus, the re-contamination of the cleaned solid surface by the contaminated ice particles or the blowing-up of the contaminating particles into the air by the blasting from the nozzle 8 is prevented. Further, the atmosphere within the jet spray chamber 6 is sufficiently neutralized electrostatically by the action of the ion neutralized device 22, and the ice particles 4 are made from water of low resistivity. Hence, there is no danger that the cleaned solid 7 will be electrified by the accumulation of the electrostatic charge or that the contaminating particles will be re-attached to the cleaned solid surface. Further, since the air atmosphere within the jet spray chamber 6 is electrically neutralized, the contaminating materials adhered to the cleaned solid surface by means of the electrostatic force can be removed with facility.

By utilizing ice which is sufficiently soft compared with the cleaned solid 6 such as a semiconductor wafer, damage to the solid surface can be avoided. On the other hand, since the hardness of ice is much greater than that of water, the cleaning efficiency thereof is far greater than that of water. For example, the foreign materials which cannot be removed by a high pressure water jet at the pressure level of 100 kg/cm²G can be removed by ice particles blasted at a low jet pressure of 2 kg/cm²G. Since a sufficiently high cleaning efficiency can be obtained by such a low jet pressure, a high pressure-proof device of a special pressure-tight structure is not necessary, which special structure becomes necessary in the case where a high pressure water jet is utilized in the cleaning. Further, there is no danger of generation of dust at the jet spray nozzle 8. In addition, since the ice particles 4 hitting the cleaned solid surface are broken into ultra-fine ice debris and the resulting ice debris removes the foreign materials attached on the solid surface, ultra-fine foreign materials, etc., which are present within the fine pattern on the semiconductor wafer, can be removed with a high efficiency.

FIG. 4 shows the water-supply portion of another embodiment of this invention. In the case of the above first embodiment, the ultrapure water 2 is supplied to the ice making container 16 in the liquid state. In the case of this embodiment, however, the ultrapure water 2 is heated to form water vapor which is then supplied to the ice making container 16. The utilization of the water vapor in this embodiment results in the formation of ice particles of still smaller particles diameters compared with the case where the liquid ultrapure water is utilized in the liquid state as it is. Thus, as shown in FIG. 4, a first heating means 30 including, for example, electric resistance heaters, is disposed at a side or sides and the bottom of the tank 1 containing the ultrapure water 2 to heat and vaporize the ultrapure water 2 within the tank 1 by means of this first heating means. The thus generated water vapor is supplied to the ice-making container 16 via a water vapor supply tube 31. Further, a second heating means 32 consisting, for example, of an electric resistance heater, is disposed at an intermediate portion of the water vapor supply tube 31 to heat and maintain the temperature of the water vapor passing therethrough by means of the second heating means 32. The water vapor passing through the supply tube 31 and then sprayed into the container 16 is refrigerated by means of a refrigerant such as liquid nitrogen supplied to the ice-making container 16 from a refrigerant supply source (not shown). Thus, the water vapor sprayed into the container 16 is frozen into ultra-fine ice particles. The diameters of the ice particles generated by the above process depend on the speed of refrigeration of the water vapor. Thus, by an appropriate control of the speed of refrigeration of the water vapor, the diameters of the ice particles can be varied and adjusted within the range of 0.1 micrometers to 20 micrometers. In this connection, it is noted that the speed of refrigeration depends, for example, on the amount of the refrigerant supplied to the ice-making container 16 and on the speed and amount of the spraying (or the spray pressure, etc.) of the water vapor into the ice-making container 16. Thus, it is possible to control and adjust the refrigeration speed of the water vapor by varying the amount of the refrigerant supplied by controlling to an appropriate level the opening of the flow control valve (not shown) disposed at an intermediate portion of the vapor supply tube 31, or by controlling to an appropriate level the outputs of the first and second heating means 30 and 32, thereby adjusting the spraying pressure of the water vapor supplied to the ice-making container 16 from the tank 1.

Although not shown in FIG. 4, the thus generated ultra-fine ice particies are, just as in the case of the first embodiment illustrated in FIG. 3, supplied to a jet spray nozzle disposed within a jet spray chamber of the cleaning housing to be sprayed and blasted therefrom together with pressurized gas onto the surface of the cleaned solid positioned within the jet spray chamber.

While description has been made of the particular embodiments of this invention, it will be understood that many modifications may be made without departing from the spirit thereof. The appended claims are contemplated to cover any such modifications as fall within the true spirit and scope of this invention.

What is claimed is:

1. A solid surface cleaning device for removing contaminating materials attached to a surface of a solid body comprising:
a tank for storing a liquid whose electrical resistivity is adjusted and reduced to a predetermined level;
frozen particle generating means, coupled to said tank, for freezing liquid supplied from the tank to generate ultra-fine frozen particles of said liquid;

a cleaning housing containing therein a jet spray chamber within which a cleaned solid body is accommodated;

jet spray means, disposed in said jet spray chamber and coupled to said frozen particle generating means, for spraying the frozen particles supplied from said frozen particle generating means onto a surface of said cleaned solid body, thereby removing contaminating materials attached to the cleaned solid surface; and exhaust means, coupled to said jet spray chamber, for rapidly exhausting a gas within the jet spray chamber together with the ice particles that have been sprayed from the jet spray nozzle onto the cleaned solid surface.

2. A solid surface cleaning device as claimed in claim 1 wherein said liquid is ultrapure water.

3. A solid surface cleaning device as claimed in claim 2 wherein said tank includes resistivity adjustment means for adjusting and reducing the electrical resistivity of said liquid, said resistivity adjusting means comprising means for forming bubbles of a gas within said liquid stored in the tank, the resistivity of the liquid being reduced and adjusted by the amount of the gas dissolved into the liquid.

4. A solid surface cleaning device as claimed in claim 3 wherein said frozen particle generating means comprises:
   a container;
   spray means, coupled to said tank means, for spraying said liquid supplied from the tank means into an interior of the container; and
   refrigerating means for refrigerating the interior of the container.

5. A solid surface cleaning device as claimed in claim 4 further comprising heating means for heating and vaporizing said liquid stored in the tank means, wherein vapor of said liquid formed by the vaporization is supplied to said spray means of the frozen particle generating means, to be sprayed therefrom.

6. A solid surface cleaning device as claimed in claim 2 wherein said frozen particle generating means comprises:
   a container;
   spray means, coupled to said tank means, for spraying said liquid supplied from the tank means into an interior of the container; and
   refrigerating means for refrigerating the interior of the container.

7. A solid surface cleaning device as claimed in claim 6 further comprising heating means for heating and vaporizing said liquid stored in the tank means, wherein vapor of said liquid formed by the vaporization is supplied to said spray means of the frozen particle generating means, to be sprayed therefrom.

8. A solid surface cleaning device as claimed in claim 2 wherein said solid body is a semiconductor wafer.

9. A solid surface cleaning device as claimed in claim 3 wherein said solid body is a semiconductor wafer.

10. A solid surface cleaning device as claimed in claim 1 wherein said frozen particle generating means comprises:
    a container;
    spray, coupled to said tank means, for spraying said liquid supplied from the tank into an interior of the container; and
    refrigerating means for refrigerating the interior of the container.

11. A solid surface cleaning device as claimed in claim 10 comprising heating means for heating and vaporizing the liquid stored in the tank, wherein a vapor of the liquid formed by the vaporization is supplied to said spray means of the frozen particle generating means to be sprayed therefrom.

* * * * *